United States Patent
Tsai

(10) Patent No.: US 11,627,686 B2
(45) Date of Patent: Apr. 11, 2023

(54) LIQUID COOLING DEVICE

(71) Applicant: COOLER MASTER CO., LTD., New Taipei (TW)

(72) Inventor: Shui-Fa Tsai, New Taipei (TW)

(73) Assignee: COOLER MASTER CO., LTD., Taipei (TW)

( * ) Notice: Subject to any disclaimer, the term of this patent is extended or adjusted under 35 U.S.C. 154(b) by 0 days.

(21) Appl. No.: 17/468,443

(22) Filed: Sep. 7, 2021

(65) Prior Publication Data

US 2021/0410327 A1    Dec. 30, 2021

Related U.S. Application Data

(62) Division of application No. 16/744,047, filed on Jan. 15, 2020, now Pat. No. 11,160,191.

(30) Foreign Application Priority Data

May 10, 2019  (TW) .................................. 108116240

(51) Int. Cl.
*H05K 7/20* (2006.01)

(52) U.S. Cl.
CPC ..... *H05K 7/20254* (2013.01); *H05K 7/20281* (2013.01); *H05K 7/20409* (2013.01); *H05K 7/20509* (2013.01)

(58) Field of Classification Search
None
See application file for complete search history.

(56) References Cited

U.S. PATENT DOCUMENTS

| | | | |
|---|---|---|---|
| 6,054,676 A * | 4/2000 | Wall | H01L 23/345 |
| | | | 257/E23.098 |
| 9,345,169 B1 * | 5/2016 | Campbell | H05K 7/20327 |
| 10,409,341 B2 | 9/2019 | Tsai | |
| 11,061,450 B2 * | 7/2021 | Tsai | G06F 1/20 |
| 11,160,191 B2 * | 10/2021 | Tsai | G06F 1/20 |
| 2006/0225867 A1 | 10/2006 | Park | |
| 2006/0243431 A1 | 11/2006 | Martin | |
| 2008/0029260 A1 | 2/2008 | Hu | |
| 2008/0216991 A1 | 9/2008 | Oikawa | |
| 2014/0119394 A1 | 5/2014 | Schleuning | |
| 2014/0158326 A1 * | 6/2014 | Lyon | H01L 23/473 |
| | | | 165/104.19 |
| 2016/0338223 A1 * | 11/2016 | Tsai | F28F 3/12 |
| 2017/0043437 A1 * | 2/2017 | Boday | H05K 7/20772 |
| 2017/0045307 A1 | 2/2017 | Tsai | |
| 2019/0166720 A1 | 5/2019 | Takemura | |

* cited by examiner

*Primary Examiner* — Courtney L Smith
(74) *Attorney, Agent, or Firm* — Maschoff Brennan

(57) ABSTRACT

The disclosure relates to a flow-rate adjustment component and a liquid cooling device. The flow-rate adjustment component is configured to be in contact with a plurality fins, and every two adjacent fins are spaced by a passageway. The flow-rate adjustment component includes a covering portion and at least one blocking portion. The covering portion has at least one through slot. The covering portion is in contact with the fins to cover the passageways. The through slot is connected to the passageways. The at least one blocking portion is to block one end of at least one of the passageways.

24 Claims, 18 Drawing Sheets

LIQUID COOLING DEVICE

CROSS-REFERENCE TO RELATED APPLICATIONS

This application is a divisional patent application of U.S. application Ser. No. 16/744,047, filed on Jan. 15, 2020, the entire contents of which are whereby incorporated by reference for which priority is claimed under 35 U.S.C. § 120. The U.S. application Ser. No. 16/744,047, filed on Jan. 15, 2020 is a non-provisional application claims priority under 35 U.S.C. § 119(a) on Patent Application No(s). 108116240 filed in R.O.C. Taiwan on May 10, 2019, the entire contents of which are hereby incorporated by reference.

TECHNICAL FIELD

The disclosure relates to a cooling device, more particularly to a flow-rate adjustment component and a liquid cooling device.

BACKGROUND

In computer, the multi-core processor, the north bridge chip, the south bridge chip, the graphics processing unit, and other integrated circuits (IC) are considered heat sources because they will generate heat during operation. It is known that liquid cooling system is more efficient in removing heat generated by such integrated circuits than air cooling system. In detail, a liquid cooling system usually contains a water block and a heat exchanger, where the water block is used to be in thermal contact with the heat source so that the coolant in the water block can absorb the heat and takes it to the heat exchanger, and then the heat exchanger is used to remove the heat from the coolant.

Take a multi-core processor as an example of heat source, the multi-core processor has an array of processing units; that is, the multi-core processor has an array of heat sources. During the operation, the temperature at the processing units will be higher than that at the area without the processing units, such that the multi-core processor will have multiple high-temperature areas and at least one low-temperature area. However, in the conventional water block, it supplies the same flow rate of coolant to the high-temperature area and the low-temperature area; that is, at least a certain amount of coolant is unnecessarily pumped to the low-temperature area so that the coolant is not ideally used to cool the heat sources. In other words, the cooling capacity of the conventional water block is not fully optimized in cooling the high-temperature area.

SUMMARY

The present disclosure provides a flow-rate adjustment component and a liquid cooling device that are capable of creating different flow rates of coolant among the high heat-generating area and low heat-generating area so as to improve the cooling efficiency in cooling the high heat-generating area.

One embodiment of the disclosure provides a liquid cooling device including a first thermal plate, a fin structure, a flow-rate adjustment component, and a cover. The first thermal plate has a recess. The fin structure is located at the recess of the first thermal plate and connected to first thermal plate, wherein the fin structure comprises a plurality of fins, and every two of the plurality of fins that are adjacent to each other are spaced by a passageway. The flow-rate adjustment component includes a covering portion and at least one blocking portion connected to the covering portion. The covering portion has at least one through slot, the covering portion covers the plurality of fins, the covering portion covers the passageways of the plurality of fins, the through slot is connected to the passageways of the plurality of fins, the at least one second cover blocks one end of at least one of the passageways of the plurality of fins. The cover has at least one flow inlet and at least one flow outlet. The cover is disposed on the first thermal plate and covers the recess, the at least one flow outlet is connected to the at least one flow inlet via the passageways and the through slot.

One embodiment of the disclosure provides a liquid cooling device including a first thermal plate, a fin structure, a flow-rate adjustment component, and a cover. The first thermal plate has a recess. The fin structure is located at the recess of the first thermal plate and connected to the first thermal plate. The fin structure comprises a plurality of fins, and every two of the plurality of fins that are adjacent to each other are spaced by a passageway. The flow-rate adjustment component has a through slot. The flow-rate adjustment component is in contact with the plurality of fins, the through slot is connected to the passageways, and at least two portions of the through slot are different in width. The cover has a flow inlet and a flow outlet. The cover is disposed on the first thermal plate and covers the recess, the flow outlet is connected to the flow inlet via the passageways and the through slot.

One embodiment of the disclosure provides a liquid cooling device configured to be in thermal contact with a heat source. The heat source has at least one high heat-generating area and at least one low heat-generating area on an appearance thereof. The liquid cooling device includes a heat transfer chamber, a fin structure, and a flow-rate adjustment component. The heat transfer chamber has an accommodation space, a flow inlet, and a flow outlet. The flow inlet and the flow outlet are connected to the accommodation space. The heat transfer chamber is configured to be in thermal contact with the at least one high heat-generating area and the at least one low heat-generating area of the heat source. The fin structure is located in the accommodation space and connected to the heat transfer chamber. The fin structure is located above the at least one high heat-generating area and the at least one low heat-generating area of the heat source. The fin structure includes a plurality of fins, and every two of the plurality of fins that are adjacent to each other are spaced by a passageway. The flow-rate adjustment component is located in the accommodation space so that a flow rate of coolant at at least one of the passageways that is located above the at least one high heat-generating area is higher than a flow rate of coolant at another at least one of the passageways that is located above the at least one low heat-generating area.

One embodiment of the disclosure provides a flow-rate adjustment component configured to be in contact with a plurality fins of a fin structure, and every two of the plurality of fins that are adjacent to each other being spaced by a passageway. The flow-rate adjustment component includes a covering portion and at least one blocking portion. The covering portion has at least one through slot, the covering portion is configured to be in contact with the plurality of fins, the covering portion is configured to cover the passageways, the through slot is configured to be connected to the passageways, the at least one blocking portion is connected to the covering portion and configured to block one end of at least one of the passageways.

According to the flow-rate adjustment component and the liquid cooling device discussed above, since the flow-rate adjustment component is able to block at least one of the passageways, or the through slot of the flow-rate adjustment component has a difference in width, the passageways can have a difference in flow rate. This makes it possible to decrease the flow rate of coolant to the low heat-generating area to increase the flow rate of coolant to the high heat-generating area. As such, the cooling capacity of the liquid cooling device to the high heat-generating area is improved.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Figure 1:
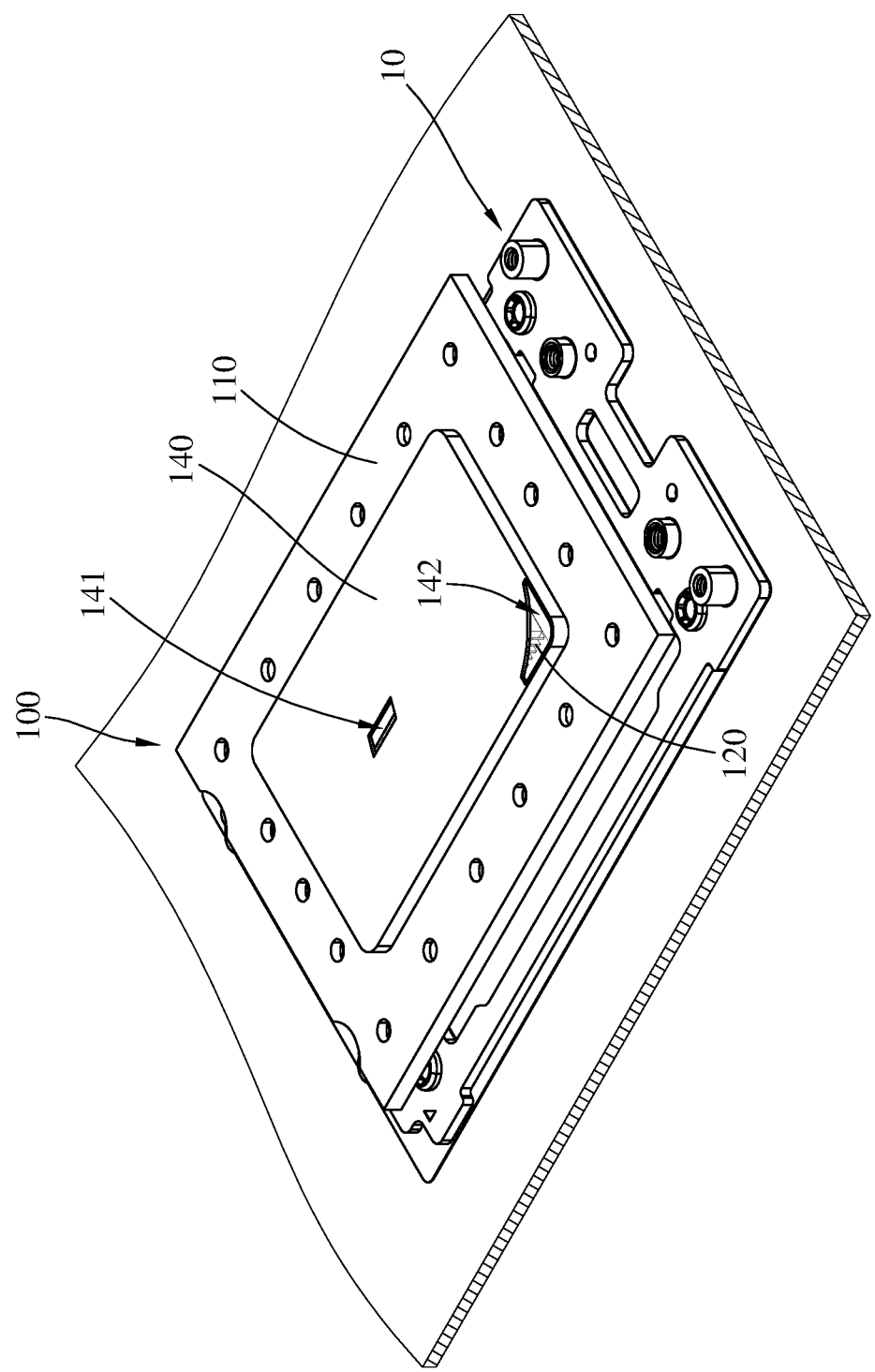
FIG. 1 is a perspective view of a liquid cooling device according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained unless the terms have a specific meaning in the present disclosure. Furthermore, in order to simplify the drawings, some conventional structures and components are drawn in a simplified manner to keep the drawings clean.

Further, the following embodiments are disclosed by the figures, and some practical details are described in the following paragraphs, but the present disclosure is not limited thereto. Furthermore, for the purpose of illustration, some of the structures and components in the figures are simplified, and wires, lines or buses are omitted in some of the figures. And the size, ratio, and angle of the components in the drawings of the present disclosure may be exaggerated for illustrative purposes, but the present disclosure is not limited thereto, and various modifications are allowed and can be made according to the following disclosure as long as it does not depart from the spirit of the present disclosure. Note that the actual size and designs of the product manufactured based on the present disclosure may also be modified according to any actual requirements.

Further, the terms, such as "end", "portion", "part", "area" and the like may be used in the following to describe specific components and structures or specific features thereon or therebetween, but are not intended to limit these components and structures. In the following, it may use terms, such as "substantially", "approximately" or "about"; when these terms are used in combination with size, concentration, temperature or other physical or chemical properties or characteristics, they are used to express that, the deviation existing in the upper and/or lower limits of the range of these properties or characteristics or the acceptable tolerances caused by the manufacturing tolerances or analysis process, would still able to achieve the desired effect.

Furthermore, unless otherwise defined, all the terms used in the disclosure, including technical and scientific terms, have their ordinary meanings that can be understood by those skilled in the art. Moreover, the definitions of the above terms are to be interpreted as being consistent with the technical fields related to the disclosure. Unless specifically defined, these terms are not to be construed as too idealistic or formal meanings. The terms of the components in the disclosure are sometimes referred to in a more concise manner, depending on the requirements of the description, and should be understood by the reader.

Figure 2:
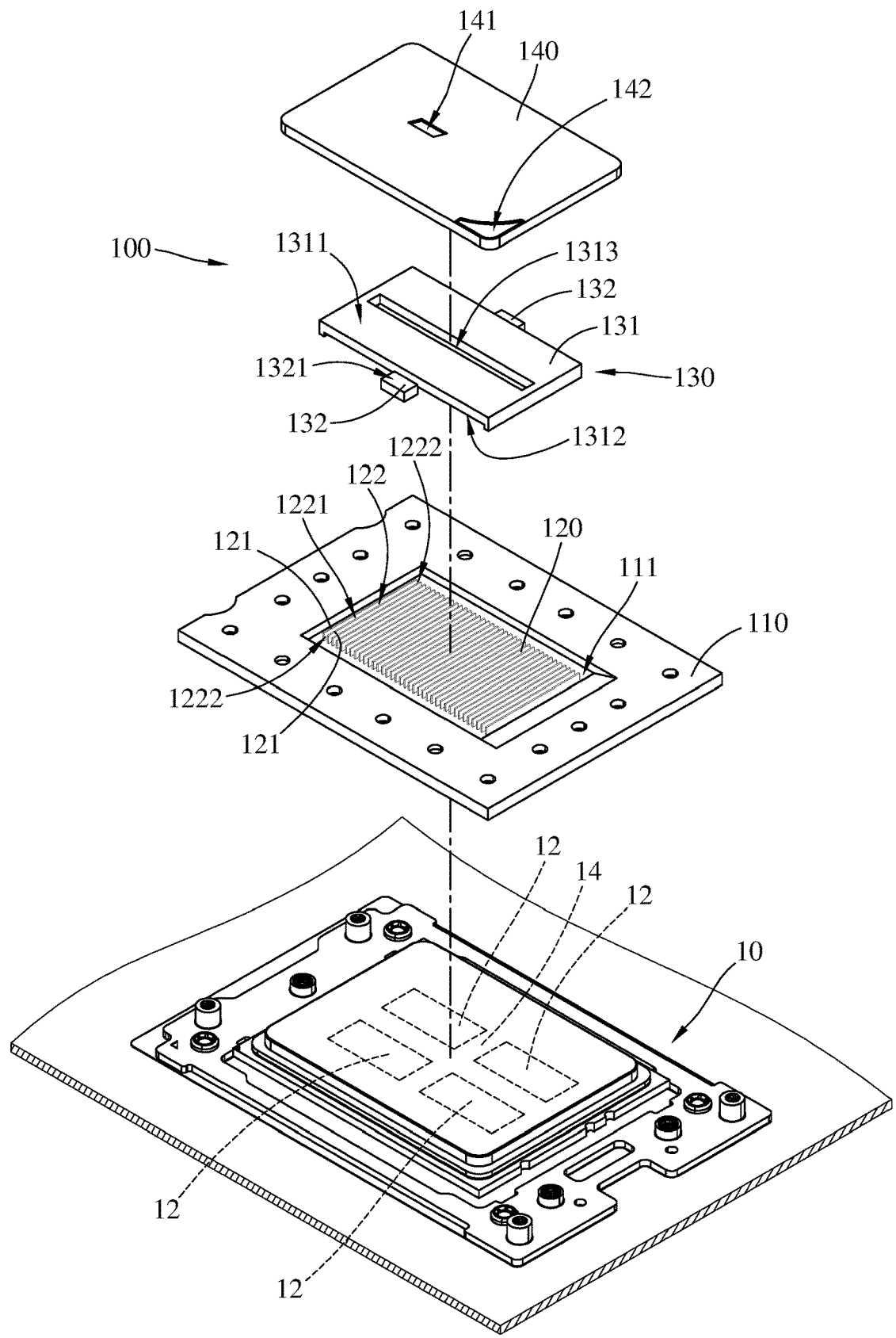
FIG. 2 is an exploded view of the liquid cooling device in FIG. 1.

Please refer to FIG. 1 to FIG. 2, where FIG. 1 is a perspective view of a liquid cooling device according to a first embodiment of the disclosure, and FIG. 2 is an exploded view of the liquid cooling device in FIG. 1.

This embodiment provides a liquid cooling device 100 and the liquid cooling device 100 is, for example, a water block that is configured to be in thermal contact with a heat source 10. The heat source 10 is, for example, a multi-core processor, a north bridge chip, a south bridge chip, a graphics processing unit, or other integrated circuits (IC). In this embodiment, the heat source 10 is, for example, a quad-core processor, meaning that the heat source 10 has four processing units. According to the specification of the heat source 10, the heat source 10 is designed to have four high heat-generating areas 12 and at least one low heat-generating area 14 on the appearance, where the four high heat-generating areas 12 respectively correspond to the four processing units in the heat source 10, and the low heat-generating area 14 corresponds to the area between the processing units; that is the low heat-generating area 14 represents the area between the high heat-generating areas 12.

The liquid cooling device 100 includes a first thermal plate 110, a fin structure 120, a flow-rate adjustment component 130, and a cover 140.

The first thermal plate 110 is configured to be in thermal contact with the heat source 10 and has a recess 111. The fin structure 120 is located at the recess 111 of the first thermal plate 110 and is connected to the first thermal plate 110. The fin structure 120 includes a plurality of fins 121, and every two adjacent fins 121 are spaced by a passageway 122. Each of the passageways 122 has a top side 1221 and two lateral end sides 1222. The top side 1221 is a side of the passageway 122 facing the cover 140, and the lateral end sides 1222 are respectively located at two opposite sides of the top side 1221.

In addition, at least one of the passageways 122 is located above the high heat-generating areas 12 of the heat source 10, and another at least one of the passageways 122 is located above the low heat-generating area 14 of the heat source 10.

The cover 140 has a flow inlet 141 and a flow outlet 142. The cover 140 is disposed on the first thermal plate 110 and able to cover the recess 111. The at least one flow outlet 142 is connected to the at least one flow inlet 141 via the recess 111, where the flow inlet 141 is for the coolant (not shown) to flow into the recess 111.

Figure 3:
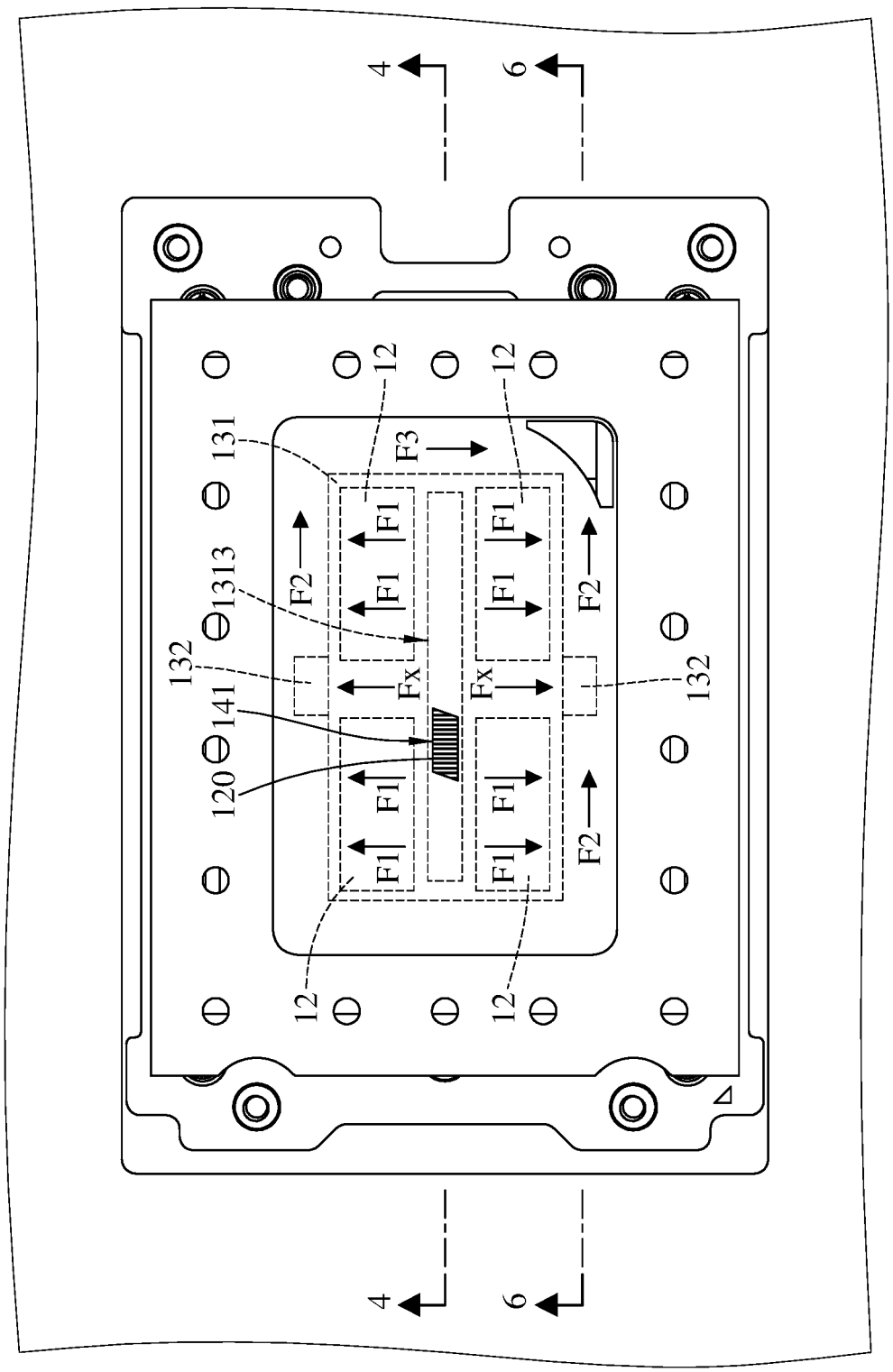
FIG. 3 is a top view of the liquid cooling device in FIG. 1.
Figure 4:
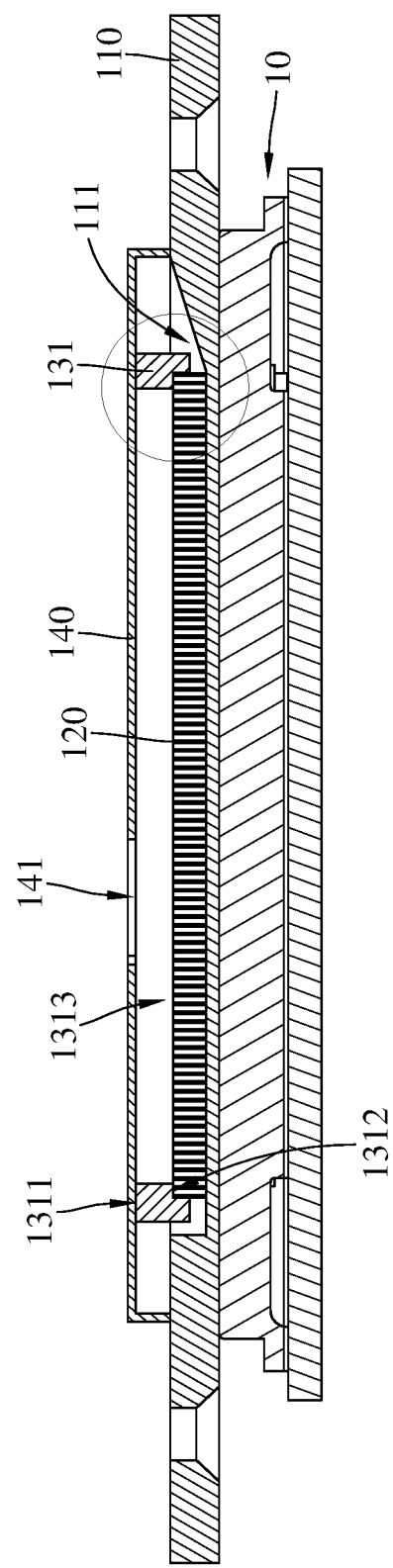
FIG. 4 is a cross-sectional view of the liquid cooling device in FIG. 3 taken along line 4-4.
Figure 5:
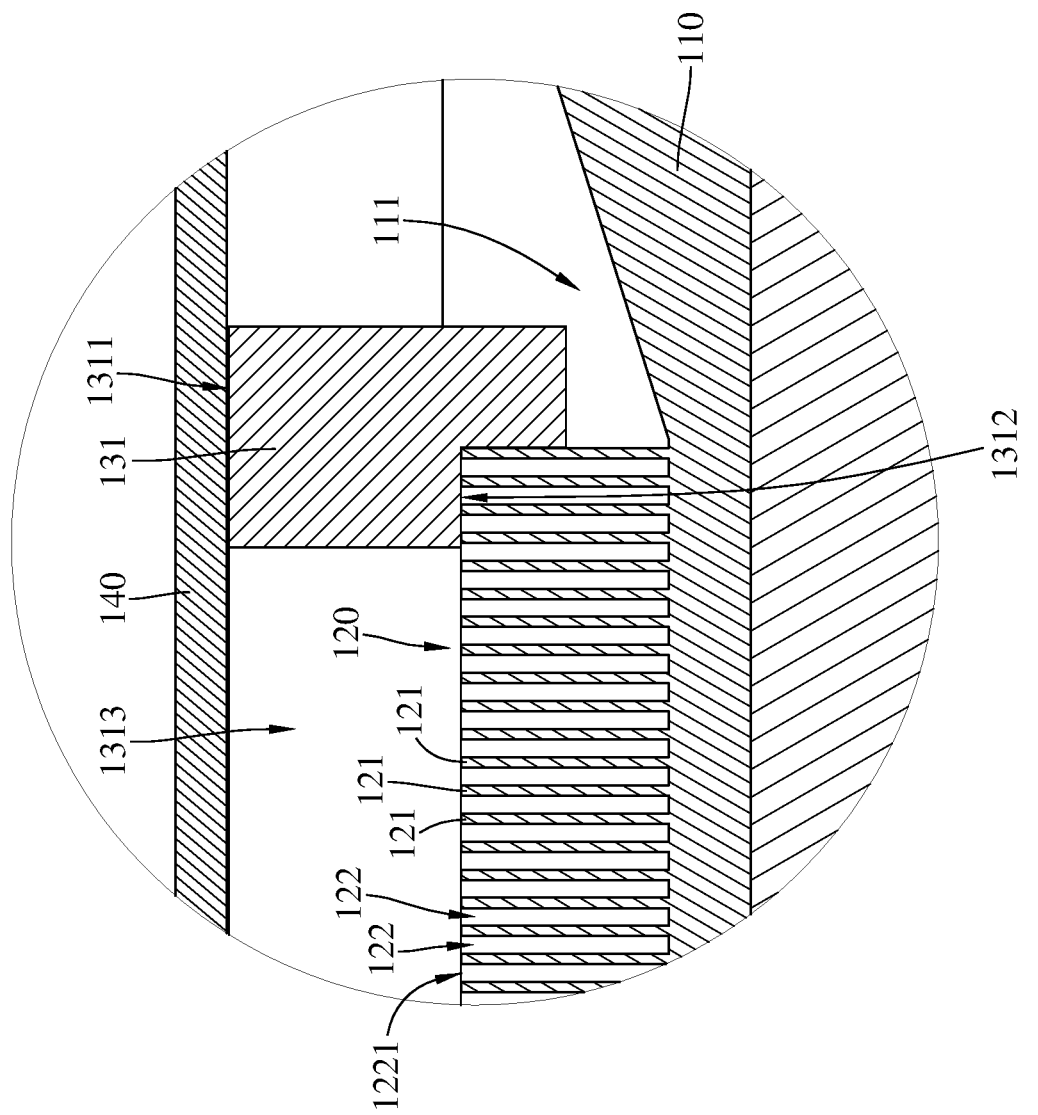
FIG. 5 is an enlarged view of the liquid cooling device in FIG. 4.
Figure 6:
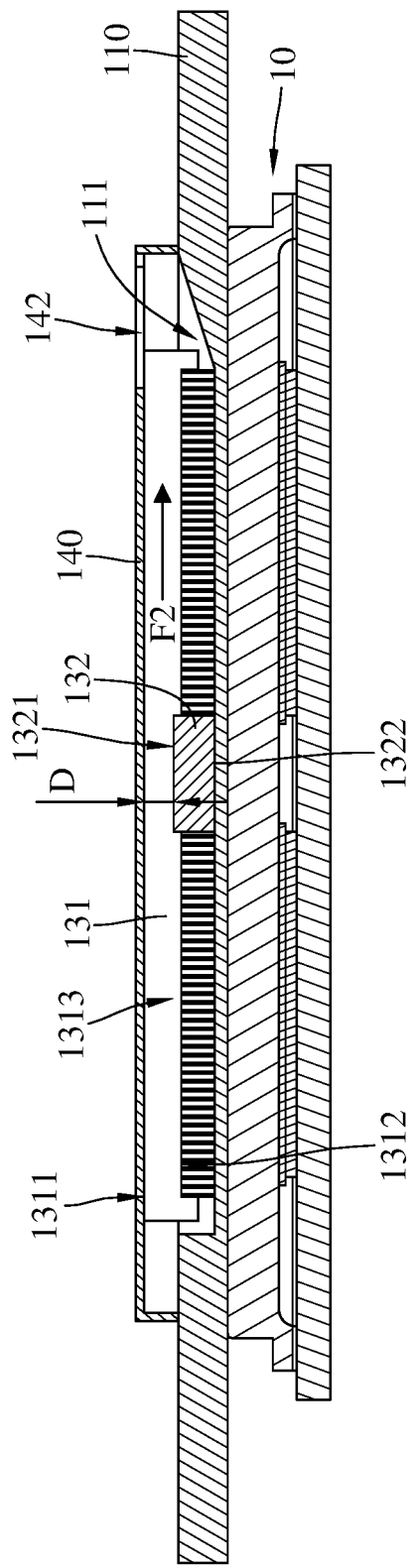
FIG. 6 is a cross-sectional view of the liquid cooling device in FIG. 3 taken along line 6-6.
Figure 7:
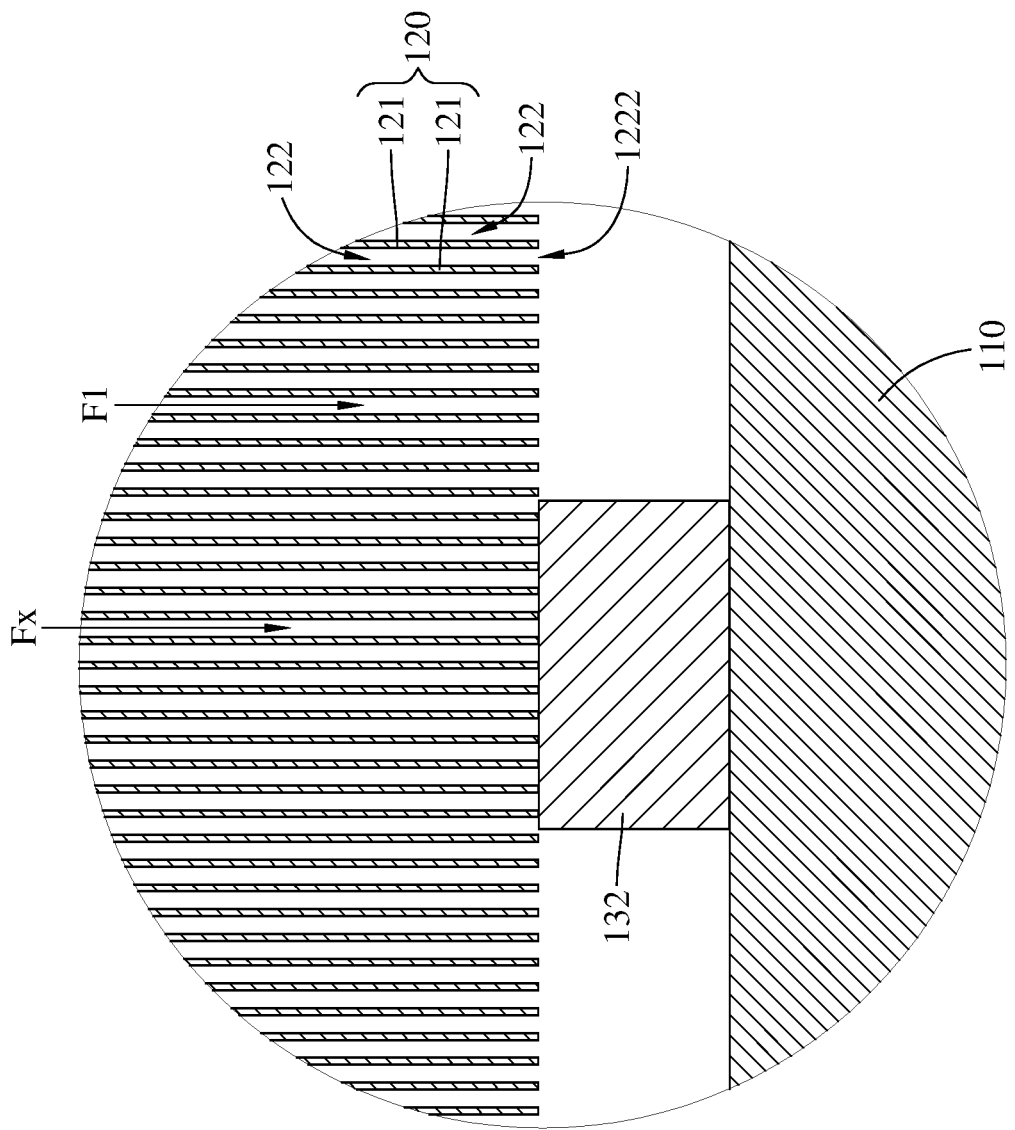
FIG. 7 is an enlarged view of the liquid cooling device in FIG. 6.

Please refer to FIG. 3 to FIG. 7, where FIG. 3 is a top view of the liquid cooling device in FIG. 1, FIG. 4 is a cross-sectional view of the liquid cooling device in FIG. 3 taken along line 4-4, FIG. 5 is an enlarged view of the liquid cooling device in FIG. 4, FIG. 6 is a cross-sectional view of the liquid cooling device in FIG. 3 taken along line 6-6, and FIG. 7 is an enlarged view of the liquid cooling device in FIG. 6. Note that the FIG. 6 and FIG. 7 are taken from planes perpendicular to each other.

As shown in FIG. 3 to FIG. 5, the flow-rate adjustment component 130 includes a covering portion 131 and two blocking portions 132. The covering portion 131 has a first surface 1311, a second surface 1312, and at least one through slot 1313. The first surface 1311 is located closer to the cover 140 than the second surface 1312, and the first surface 1311 is configured to be in contact with the cover 140. The second surface 1312 of the covering portion 131 is configured to be in contact with a side of the fins 121 facing the cover 140, such that the covering portion 131 is able to cover most of the passageways 122. The through slot 1313 penetrates the first surface 1311 and the second surface 1312 and is connected to the flow inlet 141, such that the flow inlet 141 is able to be connected to the top sides 1221 of the passageways 122 via the through slot 1313. In other words, as the covering portion 131 is disposed on the fins 121, most portions of the top sides 1221 of the passageways 122 are covered by the covering portion 131, and only little portions of the top sides 1221 of the passageways 122 are connected to the through slot 1313.

As shown in FIG. 3 and FIG. 6 to FIG. 7, the two blocking portions 132 are respectively connected to two opposite sides of the covering portion 131 and respectively cover the opposite lateral end sides 1222 of some of the passageways 122. In more detail, in this embodiment, the blocking portions 132 are blocking the passageways 122 that are located above the low heat-generating area 14. Therefore, some of the lateral end sides 1222 that are not covered by the blocking portions 132 are connected to the flow outlet 142, and the other lateral end sides 1222 that are covered by the blocking portions 132 are not connected to the flow outlet 142.

In addition, each blocking portion 132 has a third surface 1321 and a fourth surface 1322 opposite the third surface 1321. The third surface 1321 and the fourth surface 1322 are located at the same side of the first surface 1311, and the third surface 1321 is located closer to the first surface 1311 than the fourth surface 1322. That is, the third surface 1321 is located closer to the cover 140 than the fourth surface 1322, and the third surface 1321 is spaced apart from the cover 140. The fourth surface 1322 is able to be in contact with the first thermal plate 110. Therefore, the blocking portions 132 are spaced apart from the cover 140, allowing the flow outlet 142 to connect to the lateral end sides 1222 of the passageways 122 that are located on the side of the blocking portion 132 opposite the flow outlet 142 so as to ensure that the coolant on either side of the blocking portion 132 can flow to the flow outlet 142.

As shown in FIG. 3 and FIG. 7, the coolant (not shown) flowing into the flow inlet 141 is able to flow into the through slot 1313 and then flow into the top sides 1221 of the passageways 122. Since the blocking portions 132 blocks the lateral end sides 1222 of the passageways 122 that are located above the low heat-generating area 14 but do not block the passageways 122 that are located above the high heat-generating areas 12, only a few amount of the coolant will be flowing through the passageways 122 that are located above the low heat-generating area 14, and most of the coolant will be flowing through the passageways 122 that are located above the high heat-generating areas 12 so as to efficiently remove the heat generated by the high heat-generating areas 12. In other words, with the help that the blocking portions 132 block the lateral end sides 1222 of some of the passageways 122 that are located above the low heat-generating area 14, only a little amount of the coolant will flow along the path Fx and that is not even allowed to flow out of the passageways 122. And the other part of the coolant is allowed to flow through the other passageways 122 that are located above the high heat-generating areas 12 along the paths F1, F2, and F3 and then flow to the flow outlet 142. Accordingly, the flow rate (i.e., the volumetric flow rate) of the coolant at some of the passageways 122 that are located above the high heat-generating areas 12 is higher than that at another some of the passageways 122 that are located above the low heat-generating area 14, such that the cooling efficiency of the liquid cooling device 100 to the high heat-generating areas 12 is improved.

In this embodiment, the flow-rate adjustment component 130 includes two blocking portions 132 that are respectively used to block the opposite lateral end sides 1222 of some of the passageways 122, but the disclosure is not limited thereto. In some other embodiments, the flow-rate adjustment component may only include one blocking portion for blocking one of the lateral end side of the passageway.

In this embodiment, the blocking portions 132 can block more than one passageways 122, but the disclosure is not limited thereto. In some other embodiments, the blocking portion may only block one passageway.

Figure 8:
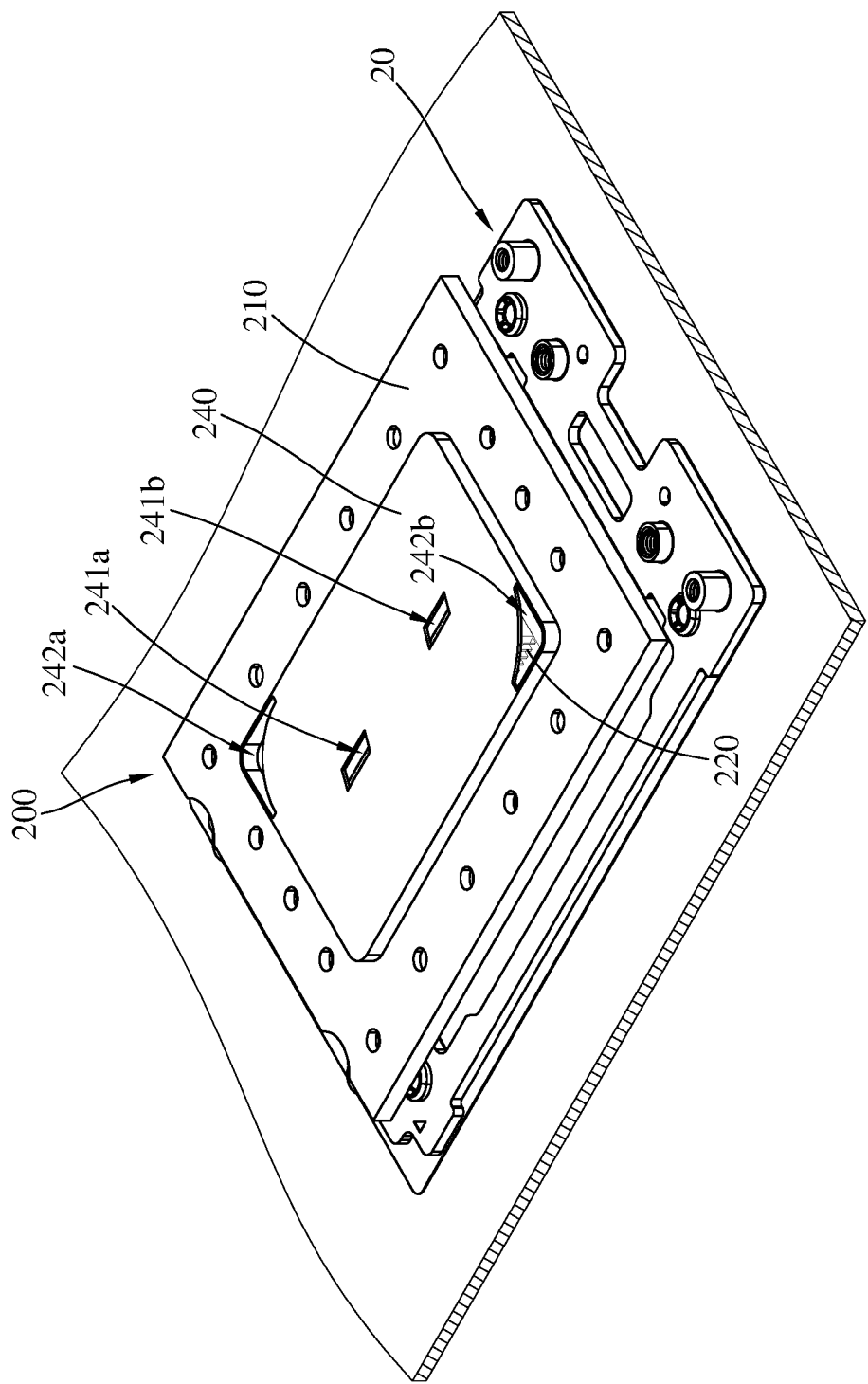
FIG. 8 is a perspective view of a liquid cooling device according to a second embodiment of the disclosure.
Figure 9:
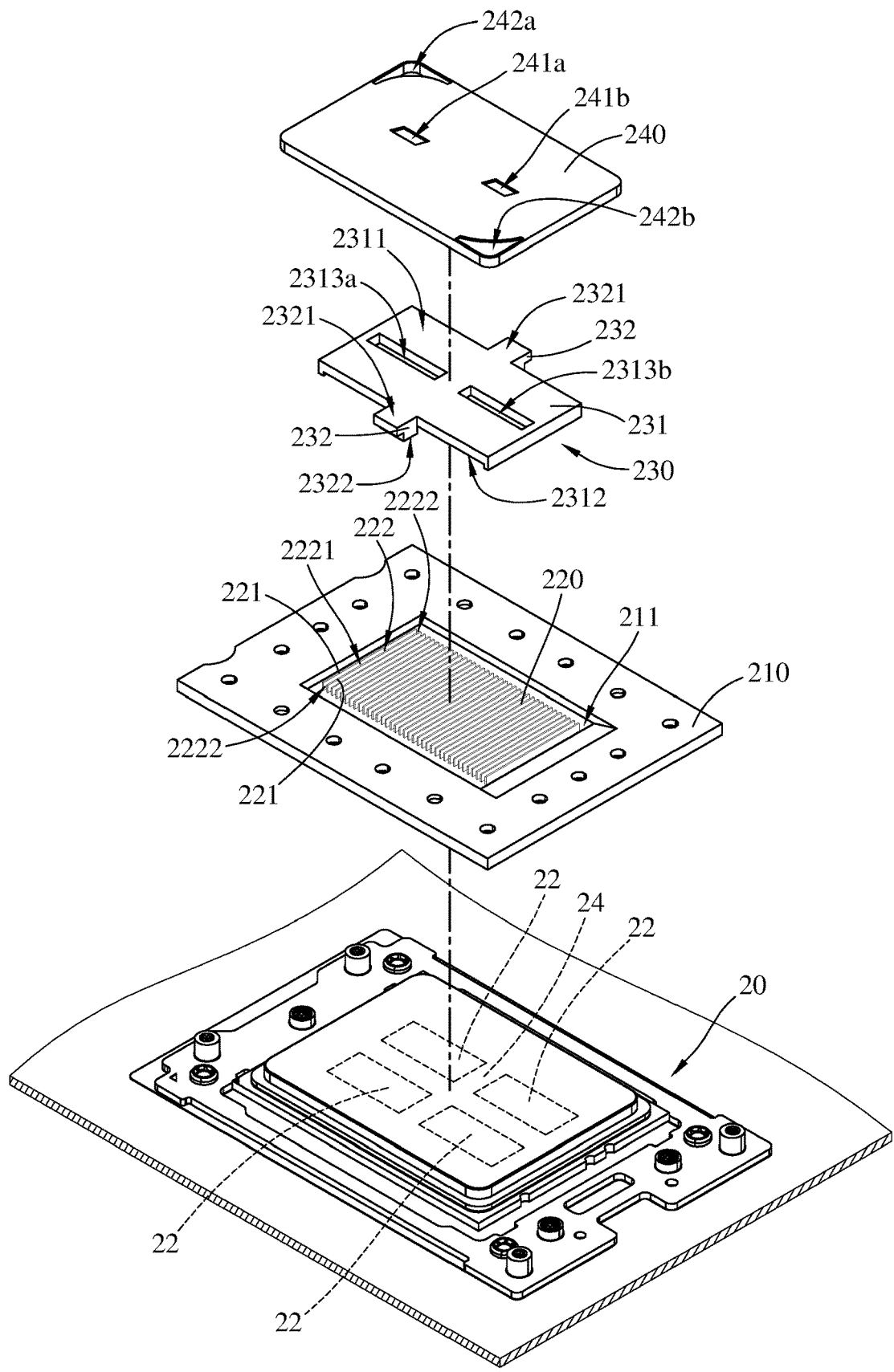
FIG. 9 is an exploded view of the liquid cooling device in FIG. 8.

Please refer to FIG. 8 and FIG. 9, where FIG. 8 is a perspective view of a liquid cooling device according to a second embodiment of the disclosure, and FIG. 9 is an exploded view of the liquid cooling device in FIG. 8.

This embodiment provides a liquid cooling device 200 and the liquid cooling device 200 is, for example, a water block that is configured to be in thermal contact with a heat source 20. The heat source 20 is, for example, a multi-core processor, a north bridge chip, a south bridge chip, a graphics processing unit, or other integrated circuits (IC). In this embodiment, the heat source 20 is, for example, a quad-core processor, meaning that the heat source 20 has four processing units. According to the specification of the heat source 20, the heat source 20 is designed to have four high heat-generating areas 22 and at least one low heat-generating area 24 on the appearance, where the four high heat-generating areas 22 respectively correspond to the four processing units in the heat source 20, and the low heat-generating area 24 corresponds to the area between the processing units; that is the low heat-generating area 24 represents the area between the high heat-generating areas 22.

The liquid cooling device 200 includes a first thermal plate 210, a fin structure 220, a flow-rate adjustment component 230, and a cover 240.

The first thermal plate 210 is configured to be in thermal contact with the heat source 20 and has a recess 211. The fin structure 220 is located at the recess 211 of the first thermal plate 210 and is connected to the first thermal plate 210. The fin structure 220 includes a plurality of fins 221, and every two adjacent fins 221 are spaced by a passageway 222. Each of the passageways 222 has a top side 2221 and two lateral end sides 2222. The top side 2221 is a side of the passageway 222 facing the cover 240, and the lateral end sides 2222 are respectively located at two opposite sides of the top side 2221.

In addition, at least one of the passageways 222 is located above the high heat-generating areas 22 of the heat source 20, and another at least one of the passageways 222 is located above the low heat-generating area 24 of the heat source 20.

The cover 240 has two flow inlets 241a and 241b and two flow outlets 242a and 242b. The flow outlets 242a and 242b are respectively located at two diagonal corners of the covers 240, and the flow inlets 241a and 241b are located between the flow outlets 242a and 242b. The cover 240 is disposed on the first thermal plate 210 and able to cover the recess 211. The flow outlets 242a and 242b are respectively connected to the flow inlets 241a and 241b via the recess 211, where the flow inlets 241a and 241b are for the coolant (not shown) to flow into the recess 211.

The flow-rate adjustment component 230 includes a covering portion 231 and two blocking portions 232. The covering portion 231 has a first surface 2311, a second surface 2312, and two through slots 2313a and 2313b. The first surface 2311 is located closer to the cover 240 than the second surface 2312. The first surface 2311 can be in contact with the cover 240. The second surface 2312 of the covering portion 231 can be in contact with a side of the fins 221 facing the cover 240, such that the covering portion 231 is able to cover most of the passageways 222. The through slots 2313a and 2313b penetrate the first surface 2311 and the second surface 2312 and are respectively connected to the flow inlets 241a and 241b, such that the flow inlets 241a and 241b are able to be connected to the top sides 2221 of the passageways 222 via the through slots 2313a and 2313b. In other words, as the covering portion 231 is disposed on the fins 221, most portions of the top sides 2221 of the passageways 222 are covered by the covering portion 231, and only little portions of the top sides 2221 of the passageways 222 are connected to the through slots 2313a and 2313b.

The two blocking portions 232 are respectively connected to two opposite sides of the covering portion 231 and respectively cover the opposite lateral end sides 2222 of some of the passageways 222. In more detail, in this embodiment, the blocking portions 232 are blocking the passageways 222 that are located above the low heat-generating area 24. Therefore, some of the lateral end sides 2222 that are not covered by the blocking portion 232 are connected to the flow outlets 242a and 242b, and the other lateral end sides 2222 that are blocked by the blocking portion 232 are not connected to the flow outlets 242a and 242b.

In addition, each blocking portion 232 has a third surface 2321 and a fourth surface 2322 opposite the third surface 2321. The third surface 2321 is located closer to the cover 240 than the fourth surface 2322. The third surface 2321 is able to be in contact with the cover 240, and the fourth surface 2322 is able to be in contact with the first thermal plate 210. Therefore, due to the covering portion 231 and the blocking portions 232, the flow inlets 241a and 241b are not be able to connect to each other, and the flow outlets 242a and 242b are not able to connect to each other, either.

In the previous embodiments, the flow inlets 241a and 241b are not be able to connect to each other, and the flow outlets 242a and 242b are not be able to connect to each other, either, but the disclosure is not limited thereto. In some other embodiments, the flow inlets may be connected to each other, and the flow outlets may be connected to each other as well.

Figure 10:
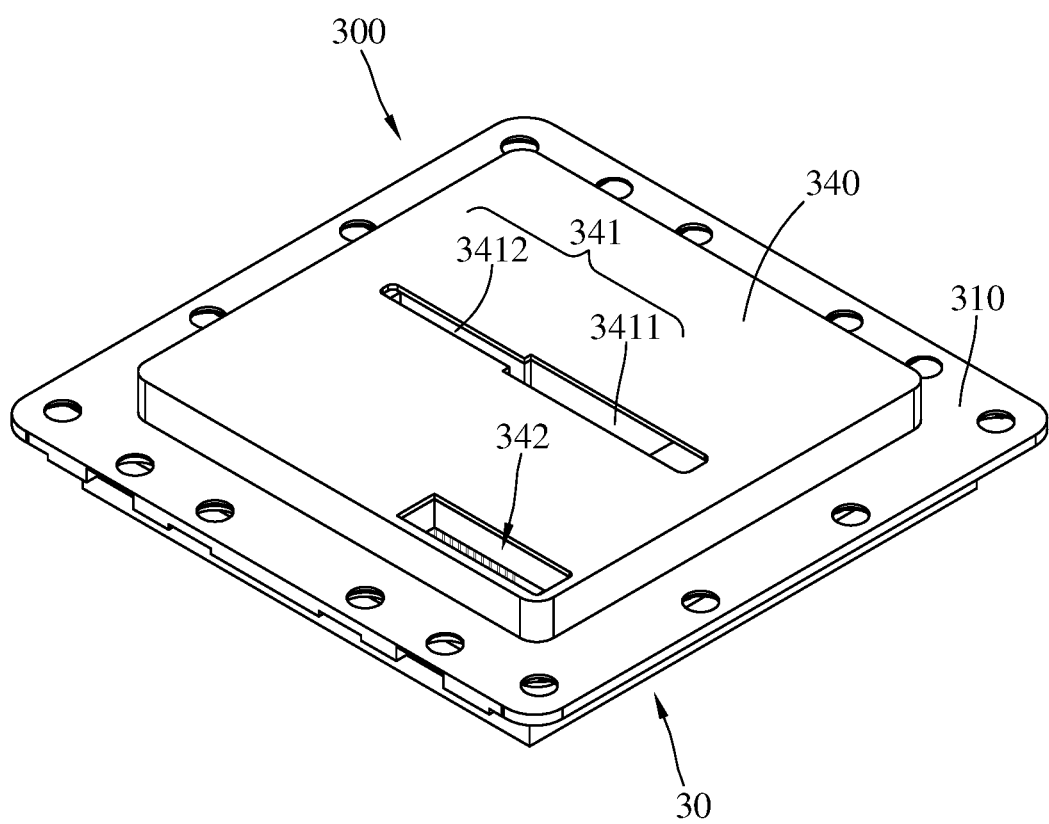
FIG. 10 is a perspective view of a liquid cooling device according to a third embodiment of the disclosure.
Figure 11:
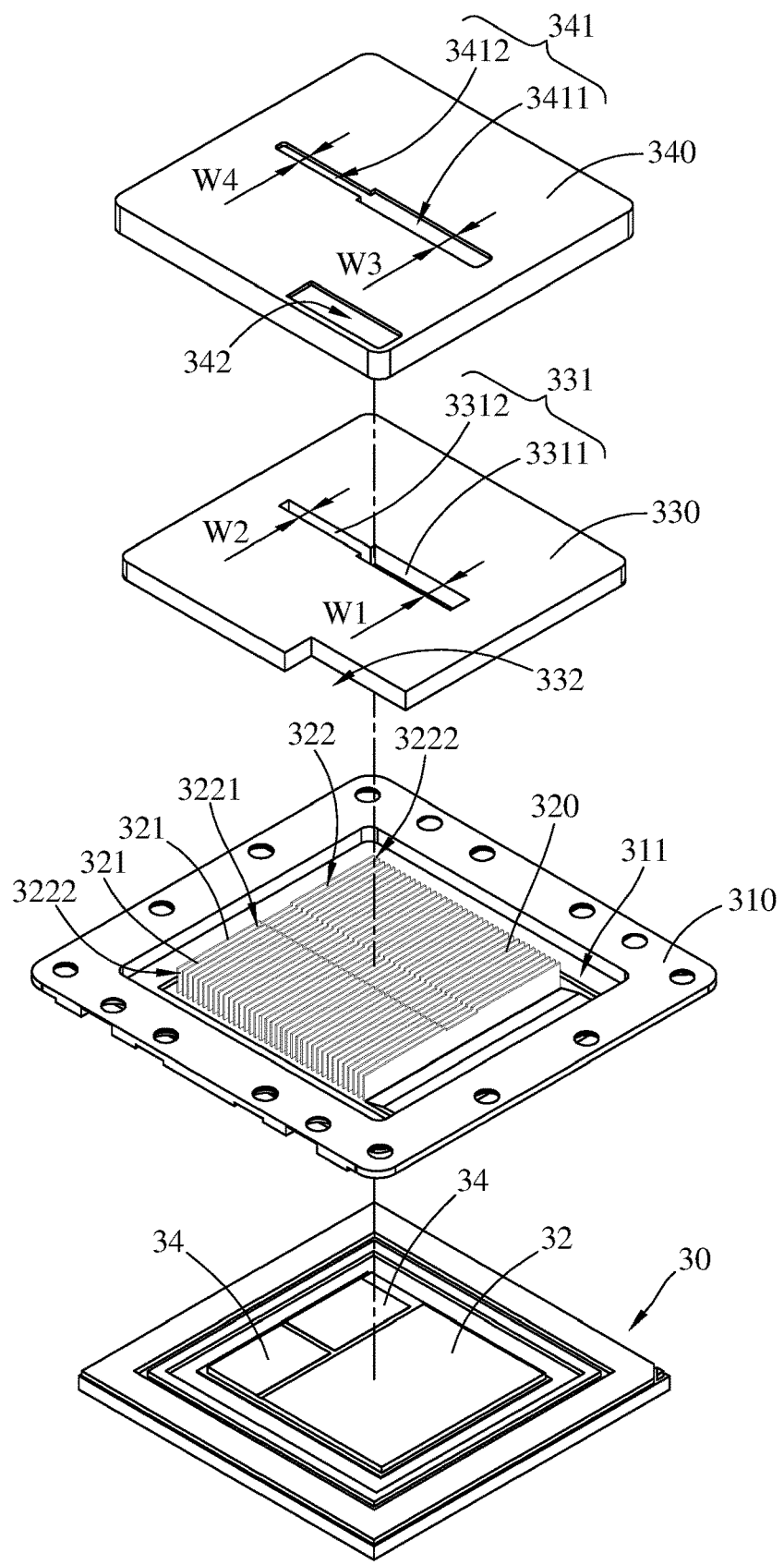
FIG. 11 is an exploded view of the liquid cooling device in FIG. 10.
Figure 12:
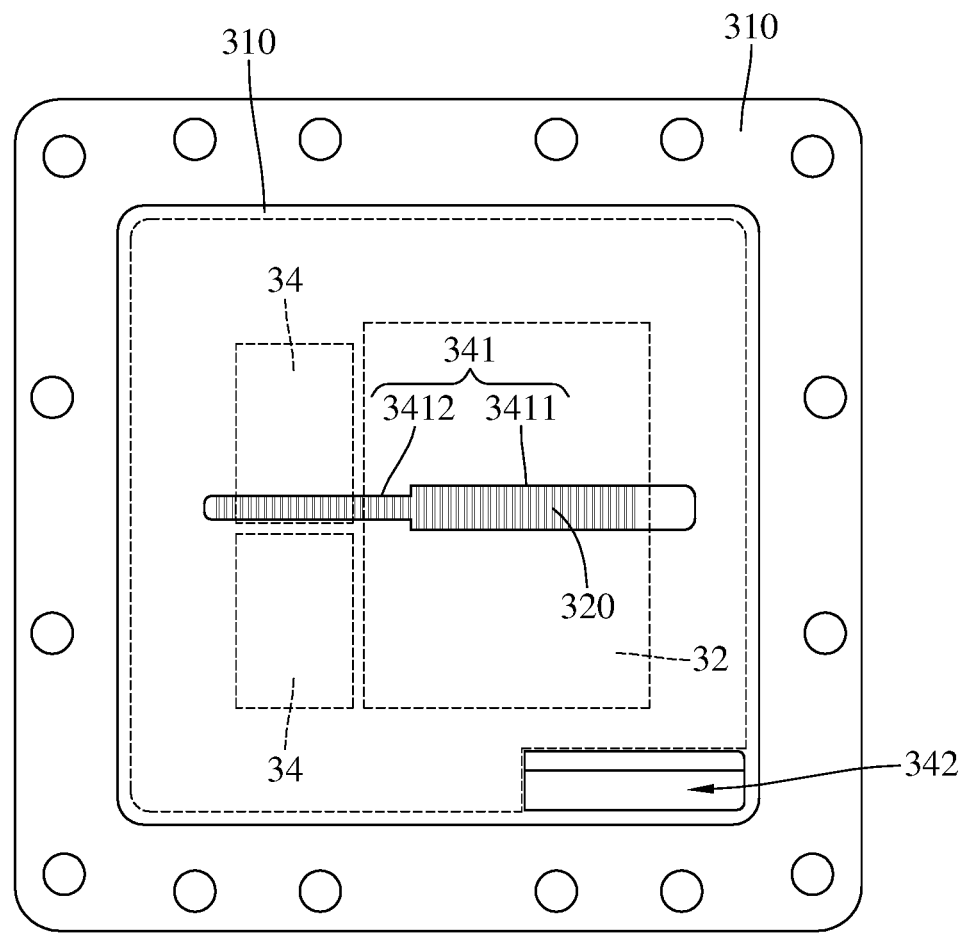
FIG. 12 is a top view of the liquid cooling device in FIG. 10.

Please refer to FIG. 10 to FIG. 12, where FIG. 10 is a perspective view of a liquid cooling device according to a third embodiment of the disclosure, FIG. 11 is an exploded view of the liquid cooling device in FIG. 10, and FIG. 12 is a top view of the liquid cooling device in FIG. 10.

This embodiment provides a liquid cooling device 300 and the liquid cooling device 300 is, for example, a water block that is configured to be in thermal contact with a heat source 30. The heat source 30 is, for example, a multi-core processor, a north bridge chip, a south bridge chip, a graphics processing unit, or other integrated circuits (IC). In this embodiment, the heat source 30 is, for example, a quad-core processor, but the heat source 30 is designed to have only one high heat-generating area 32 and two low heat-generating areas 34.

The liquid cooling device 300 includes a first thermal plate 310, a fin structure 320, a flow-rate adjustment component 330, and a cover 340.

The first thermal plate 310 is configured to be in thermal contact with the heat source 30 and has a recess 311. The fin structure 320 is located at the recess 311 of the first thermal plate 310 and is connected to the first thermal plate 310. The fin structure 320 includes a plurality of fins 321, and every two adjacent fins 321 are spaced by a passageway 322. Each of the passageways 322 has a top side 3221 and two lateral end sides 3222, where the lateral end sides 3222 are respectively located at two opposite sides of the top side 3221.

In addition, at least one of the passageways 322 is located above the high heat-generating area 32 of the heat source 30, and another at least one of the passageways 322 is located above the low heat-generating areas 34 of the heat source 30.

The flow-rate adjustment component 330 has a through slot 331. The through slot 331 has a wider portion 3311 and a narrower portion 3312 connected to the wider portion 3311, where the width W1 of the wider portion 3311 is greater than the width W2 of the narrower portion 3312. That is, at least two portions of the through slot 331 have different widths; in other words, the width of the through slot 331 is not fixed.

The flow-rate adjustment component 330 is able to cover and in contact with the fins 321. Most portions of the top sides 3221 of the passageways 322 are able to be covered by the flow-rate adjustment component 330, and only little portions of the top sides 3221 are able to be connected to the through slot 331.

The cover 340 has a flow inlet 341 and a flow outlet 342. The cover 340 is disposed on the first thermal plate 310 and able to cover the recess 311. The flow outlet 342 is able to be connected to the flow inlet 341 via the recess 211, where the flow inlet 341 is for the coolant (not shown) to flow into the recess 211. The flow inlet 341 has a wider portion 3411 and a narrower portion 3412 connected to the wider portion 3411, where the width W3 of the wider portion 3411 is greater than the width W4 of the narrower portion 3412.

In this embodiment, the wider portion 3311 and the wider portion 3411 are located above the high heat-generating area 32 of the heat source 30, and the narrower portion 3312 and the narrower portion 3412 are located above the low heat-generating areas 34 of the heat source 30, such that there will be a larger amount of coolant flowing into the passageways 322 that are located above the high heat-generating area 32 than the amount of coolant flowing into the passageways 322 that are located above the low heat-generating areas 34. As such, the flow rate (i.e., the volumetric flow rate) of the coolant at some of the passageways 322 that are located above the high heat-generating area 32 is higher than that at another some of the passageways 322 that are located above the low heat-generating areas 34, such that the cooling efficiency of the liquid cooling device 300 to the high heat-generating area 32 is improved.

Figure 13:
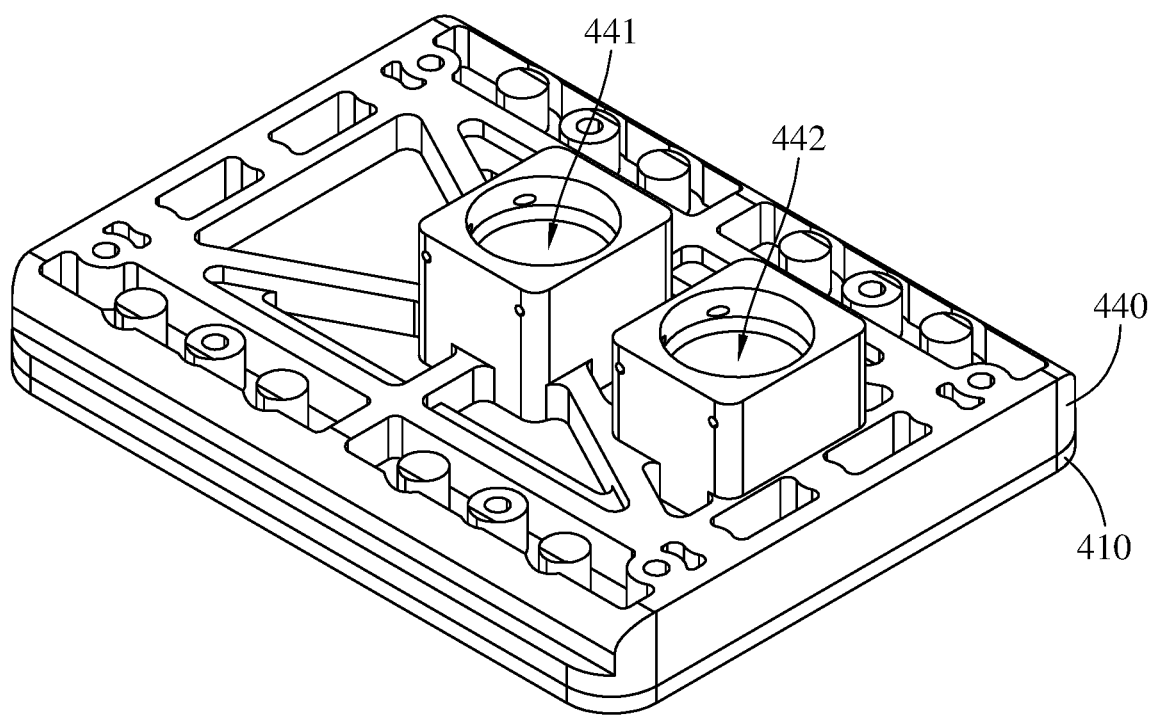
FIG. 13 is a perspective view of a liquid cooling device according to a fourth embodiment of the disclosure.
Figure 14:
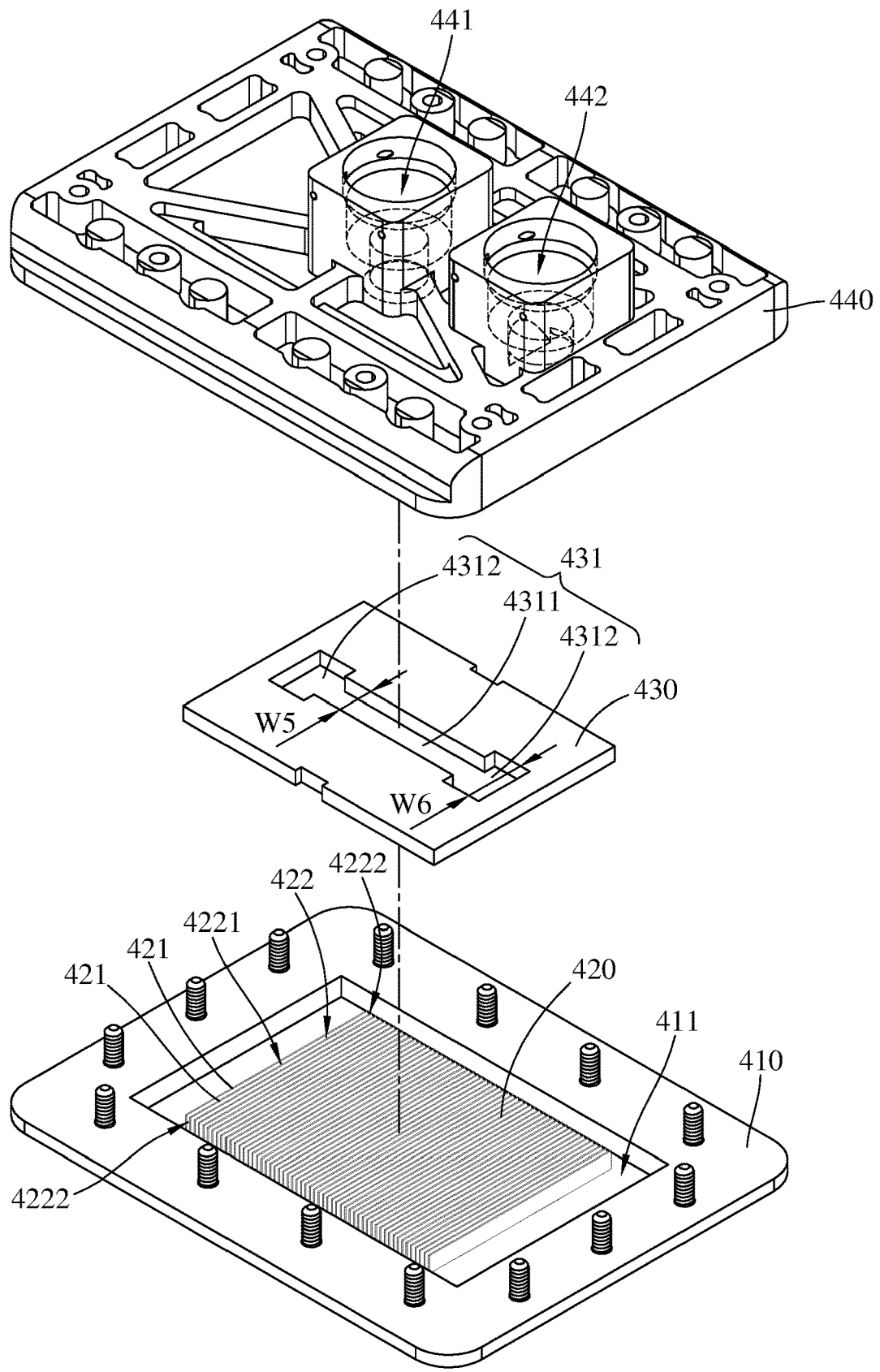
FIG. 14 is an exploded view of the liquid cooling device in FIG. 13.
Figure 15:
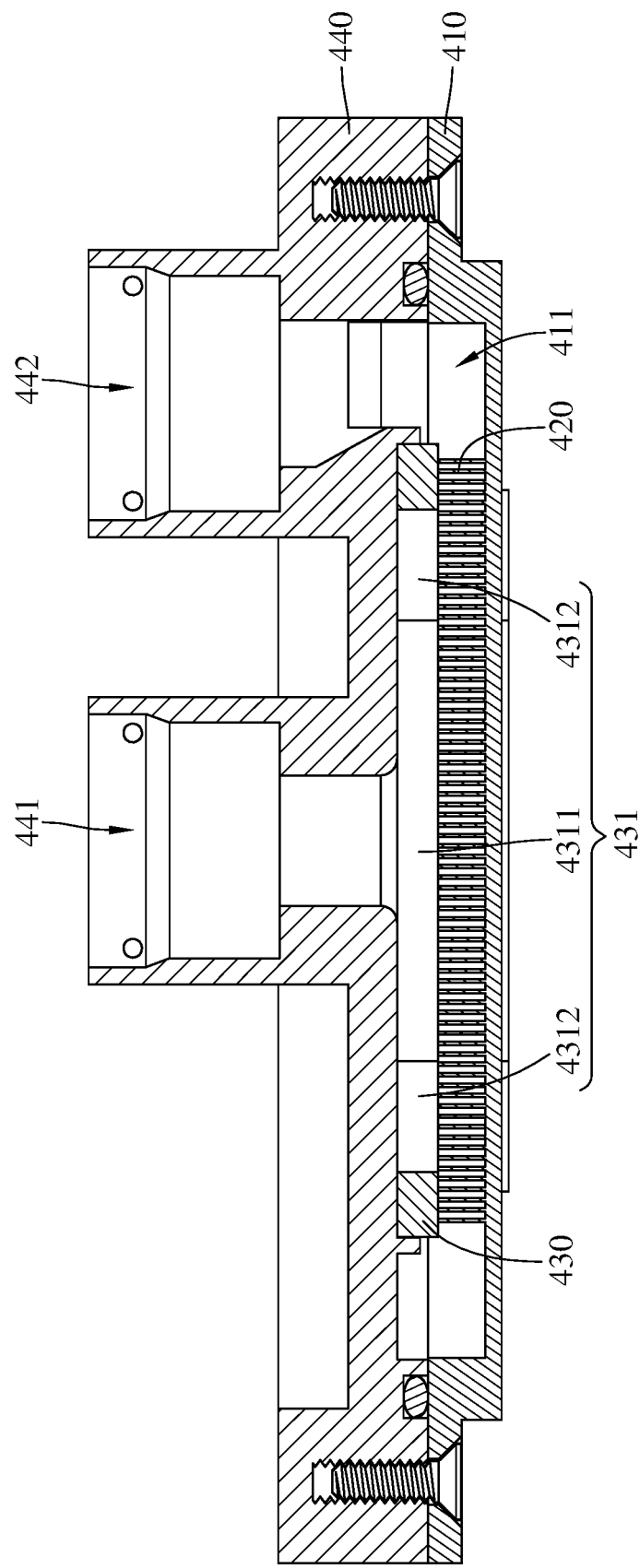
FIG. 15 is a cross-sectional view of the liquid cooling device in FIG. 13.
Figure 16:
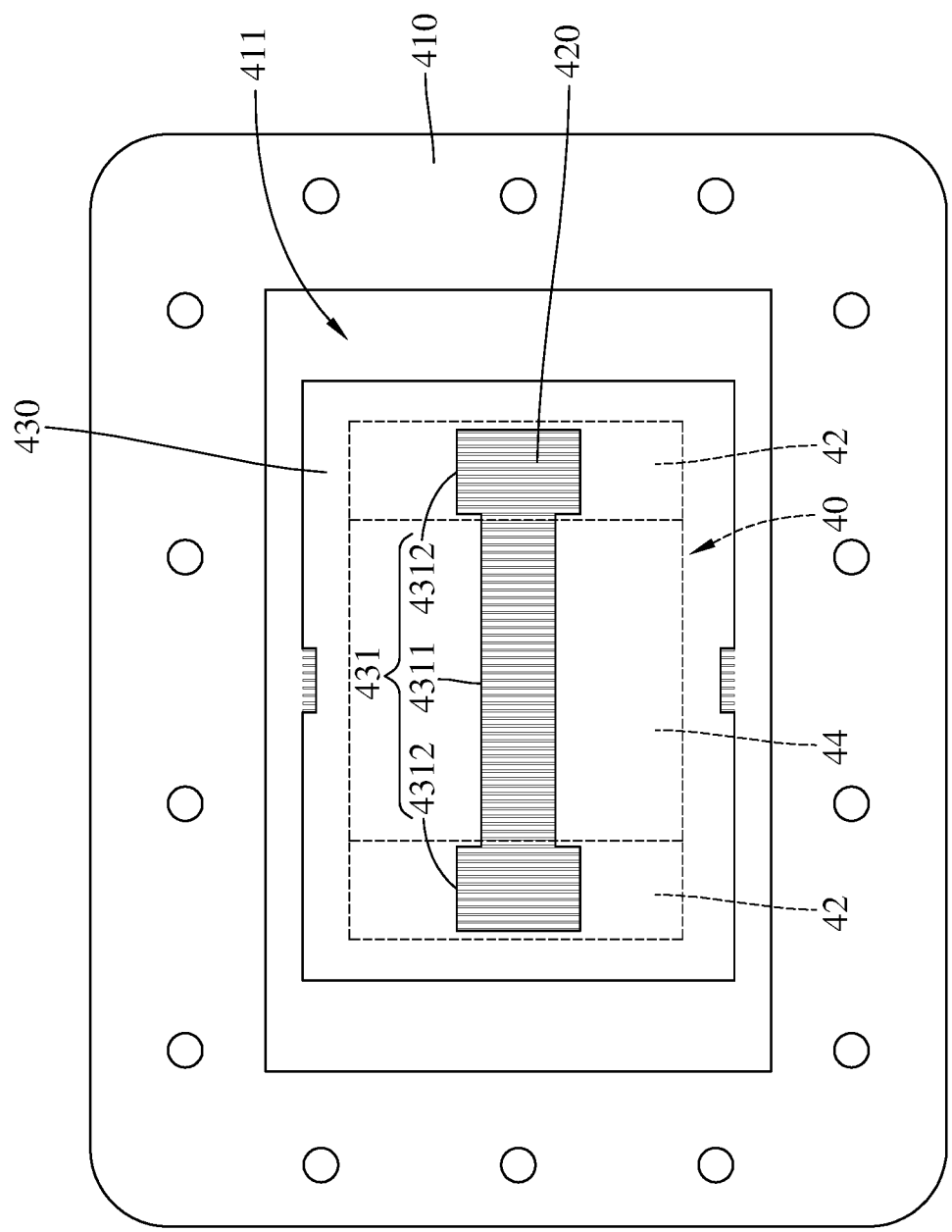
FIG. 16 is a top view of the liquid cooling device in FIG. 13.

Please refer to FIG. 13 to FIG. 16, where FIG. 13 is a perspective view of a liquid cooling device according to a fourth embodiment of the disclosure, FIG. 14 is an exploded view of the liquid cooling device in FIG. 13, FIG. 15 is a cross-sectional view of the liquid cooling device in FIG. 13, and FIG. 16 is a top view of the liquid cooling device in FIG. 13.

This embodiment provides a liquid cooling device 400 and the liquid cooling device 400 is, for example, a water block that is configured to be in thermal contact with a heat source 40. The heat source 40 is, for example, a multi-core processor, a north bridge chip, a south bridge chip, a graphics processing unit, or other integrated circuits (IC). In this embodiment, the heat source 40 is, for example, a quad-core processor.

According to the specification of the heat source 40, the heat source 40 is designed to have two high heat-generating areas 42 and a low heat-generating area 44 on the appearance, where the low heat-generating area 44 is located between the high heat-generating areas 42.

The liquid cooling device 400 includes a first thermal plate 410, a fin structure 420, a flow-rate adjustment component 430, and a cover 440.

The first thermal plate 410 is configured to be in thermal contact with the heat source 40 and has a recess 411. The fin structure 420 is located at the recess 411 of the first thermal plate 410 and is connected to the first thermal plate 410. The fin structure 420 includes a plurality of fins 421, and every two adjacent fins 421 are spaced by a passageway 422. Each of the passageways 422 has a top side 4221 and two lateral end sides 4222, and the lateral end sides 4222 are respectively located at two opposite sides of the top side 4221.

In addition, at least one of the passageways 422 is located above the high heat-generating areas 42 of the heat source 40, and another at least one of the passageways 422 is located above the low heat-generating area 44 of the heat source 40.

The flow-rate adjustment component 430 has a through slot 431. The through slot 431 has a narrower portion 4311 and two wider portions 4312. The narrower portion 4311 is located between and connected to the wider portions 4312, where the width W6 of the wider portions 4312 is greater than the width W5 of the narrower portion 4311. That is, at least two portions of the through slot 431 have different widths; in other words, the width of the through slot 431 is not fixed.

The flow-rate adjustment component 430 is able to cover and in contact with the fins 421. Most portions of the top sides 4221 of the passageways 422 are covered by the flow-rate adjustment component 430, and only little portions of the top sides 4221 of the passageways 422 are connected to the through slot 431.

The cover 440 has a flow inlet 441 and a flow outlet 442. The cover 440 is disposed on the first thermal plate 410 and able to cover the recess 411. The flow outlet 442 is connected to the flow inlet 441 via the recess 411, where the flow inlet 441 is for the coolant (not shown) to flow into the recess 411.

In this embodiment, the wider portions 4312 are located above the high heat-generating areas 42 of the heat source 40, and the narrower portion 4311 is located above the low heat-generating area 44 of the heat source 40, such that there will be a larger amount of coolant flowing into the passageways 422 that are located above the high heat-generating areas 42 than the amount of coolant flowing into the passageways 422 that are located above the low heat-generating area 44. As such, the flow rate (i.e., the volumetric flow rate) of the coolant at the some of the passageways 422 that are located above the high heat-generating areas 42 is higher than that at another some of the passageways 422 that are located above the low heat-generating area 44, such that the cooling efficiency of the liquid cooling device 400 to the high heat-generating areas 42 is improved.

In the embodiment shown in FIG. 10, the flow inlet 341 only has one wider portion 3411 and one narrower portion 3412; in the embodiment shown in FIG. 13, the through slot 431 has one narrower portion 4311 and two wider portions 4312, and the narrower portion 4311 is connected to and located between the two wider portions 4312, but the disclosure is not limited thereto. In some other embodiments, the coolant will be able to have a difference in flow rate among the passageways as long as the width of the through slot of the flow-rate adjustment component is not fixed.

In the previous embodiments, the flow-rate adjustment component is able to block the later end sides of some of the passageways and to create a flow rate difference of coolant among the passageways by different widths of the through slot, but the disclosure is not limited thereto. In some other embodiments, it is possible to create a flow rate difference of coolant among the passageways by other ways.

In the previous embodiments, there is a heat transfer chamber formed by the first thermal plate and the cover, the fin structure is accommodated in the recess of the first thermal plate, and the cover is able to cover the flow-rate adjustment component. That is, an accommodation space is formed by the recess and the cover, but the disclosure is not limited thereto. In some other embodiments, the first thermal plate may not have any recess, and the cover may have a space for accommodating the fin structure; that is, an accommodation space is formed by the recess on the cover and the flow-rate adjustment component. In addition, in the previous embodiments, the heat transfer chamber is formed by two thermal plates that are stacked on each other, but the disclosure is not limited thereto. In some other embodiments, the heat transfer chamber may be formed by two shells that are assembled to each other.

Figure 17:
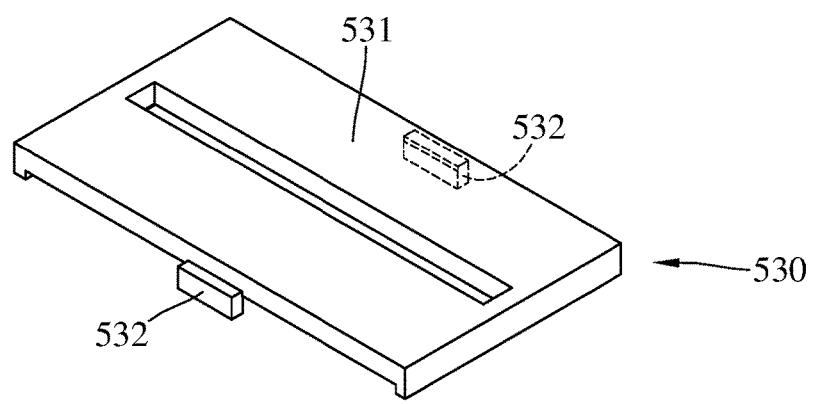
FIG. 17 is a perspective view of a liquid cooling device according to a fifth embodiment of the disclosure.
Figure 18:
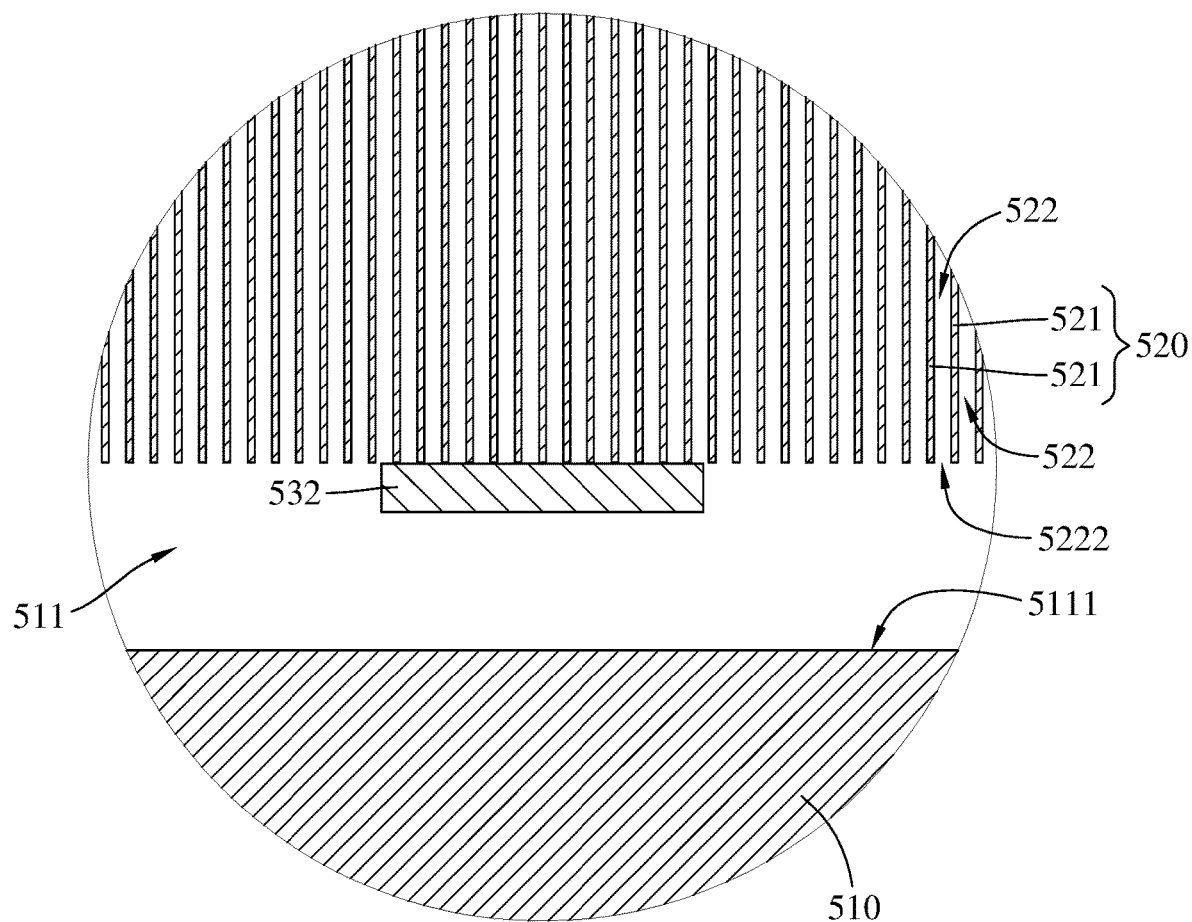
FIG. 18 is an enlarged cross-sectional view showing that the flow-rate adjustment component in FIG. 17 is cooperated with a first thermal plate and a fin structure.

The blocking portions of the aforementioned flow-rate adjustment components protrude from two opposite sides of the covering portion, but the disclosure is not limited thereto. Please refer to FIG. 17 and FIG. 18, where FIG. 17 is a perspective view of a liquid cooling device according to a fifth embodiment of the disclosure, and FIG. 18 is an enlarged cross-sectional view showing that the flow-rate adjustment component in FIG. 17 is cooperated with a first thermal plate and a fin structure. In this embodiment, a first thermal plate 510 has a recess sidewall 511 for forming a recess 511. The fin structure 520 is located at the recess 511 of the first thermal plate 510 and is connected to the first thermal plate 510. The fin structure 520 includes a plurality of fins 521, and every two adjacent fins 521 are spaced by a passageway 522. Each of the passageways 522 has two lateral end side 5222 that are respectively located at two opposite sides of the passageway 522.

A flow-rate adjustment component 530 includes a covering portion 531 and two blocking portions 532. The covering portion 531 is able to cover the fins 521. The two blocking portions 532 respectively protrude from two opposite sides of the covering portion 531, and the two blocking portions 532 are spaced apart from the recess sidewalls 5111. As such, the blocking portions 532 and the recess sidewall 5111 form a coolant channel therebetween.

Figure 19:
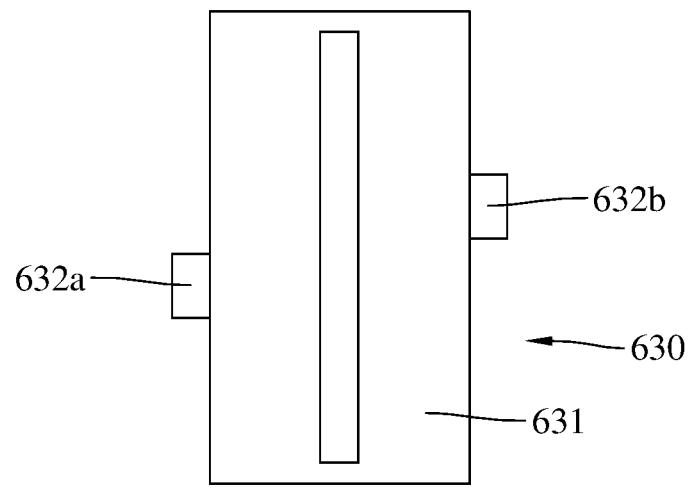
FIG. 19 is a perspective view of a liquid cooling device according to a sixth embodiment of the disclosure.

The blocking portions of the aforementioned flow-rate adjustment component are symmetrically arranged on two opposite sides of the covering portion, but the disclosure is not limited thereto. Please refer to FIG. 19, where FIG. 19 is a perspective view of a liquid cooling device according to a sixth embodiment of the disclosure. As shown in FIG. 19, a flow-rate adjustment component 630 includes a covering portion 631 and two blocking portions 632*a* and 632*b*. The two blocking portions 632*a* and 632*b* are respectively located on two opposite sides of the covering portion 531 in an asymmetry manner. In such a case, the two blocking portions 632*a* and 632*b* are able to block different passageways.

Figure 20:
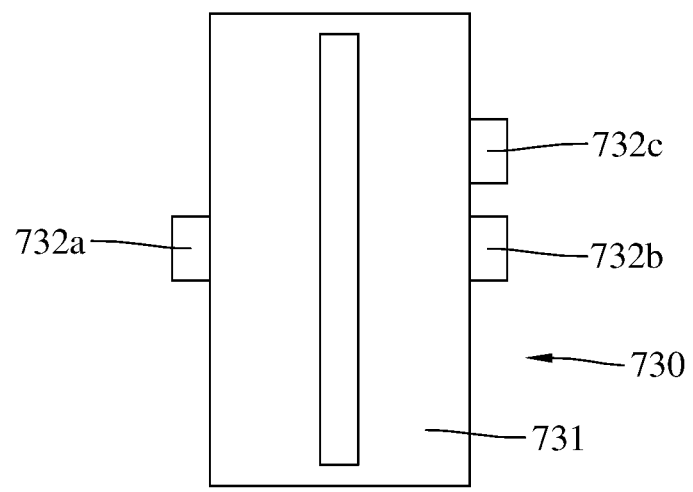
FIG. 20 is a perspective view of a liquid cooling device according to a seventh embodiment of the disclosure.

In the aforementioned flow-rate adjustment components, the blocking portions are in the same quantity at either side of the covering portion, but the disclosure is not limited thereto. Please refer to FIG. 20, where FIG. 20 is a perspective view of a liquid cooling device according to a seventh embodiment of the disclosure. As shown in FIG. 20, a flow-rate adjustment component 730 includes a covering portion 731 and three blocking portion 732*a*, 732*b*, and 732*c*. The blocking portion 732*a* is disposed on a side of the covering portion 731, and the blocking portions 732*b* and 732*c* are disposed on another side of the covering portion 731 opposite the blocking portion 732*a*.

According to the flow-rate adjustment component and the liquid cooling device discussed above, since the flow-rate adjustment component is able to block at least one of the passageways, or the through slot of the flow-rate adjustment component has a difference in width, the passageways can have a difference in flow rate. This makes it possible to decrease the flow rate of coolant to the low heat-generating area to increase the flow rate of coolant to the high heat-generating area. As such, the cooling capacity of the liquid cooling device to the high heat-generating area is improved.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A liquid cooling device comprising:
   a first thermal plate, having a recess;
   a fin structure, located at the recess of the first thermal plate and connected to first thermal plate, wherein the fin structure comprises a plurality of fins, and every two of the plurality of fins that are adjacent to each other are spaced by a passageway;
   a flow-rate adjustment component, comprising a covering portion and at least one blocking portion connected to the covering portion, wherein the covering portion has at least one through slot, the covering portion covers the plurality of fins, the covering portion covers the passageways of the plurality of fins, the through slot is connected to the passageways of the plurality of fins, the at least one blocking portion blocks one end of at least one of the passageways of the plurality of fins; and
   a cover, having at least one flow inlet and at least one flow outlet, wherein the cover is disposed on the first thermal plate and covers the recess, the at least one flow outlet is connected to the at least one flow inlet via the passageways and the through slot.

2. The liquid cooling device according to claim 1, wherein a quantity of the at least one blocking portion is two, the two blocking portions are respectively connected to two opposite sides of the covering portion, the two blocking portions block two opposite ends of at least one of the passageways which is not connected to the flow outlet.

3. The liquid cooling device according to claim 2, wherein each of the passageways has a top side facing the cover, the covering portion has a first surface and a second surface opposite the first surface, the first surface is located closer to the cover than the second surface, the first surface is in contact with a side of the plurality of fins facing the cover, and the second surface is in contact with the cover, and the flow inlet is connected to the top sides of the passageways via the through slot.

4. The liquid cooling device according to claim 3, wherein each of the passageways has two lateral end sides respectively located at two opposite sides of the top side, the two blocking portions respectively block the two lateral end sides of at least one of the passageways, the lateral end sides of at least one of the passageways which are blocked by the blocking portions are not connected to the flow outlet, and the lateral end sides of another at least one of the passageways which are not blocked by the blocking portions are connected to the flow outlet.

5. The liquid cooling device according to claim 4, wherein the blocking portion has a third surface and a fourth surface opposite the third surface, the third surface is located closer to the cover than the fourth surface, the fourth surface is in contact with the first thermal plate, the third surface is spaced apart from the cover, allowing the flow outlet to connect to the lateral end sides of at least one of the passageways that is located on a side of the blocking portion opposite the flow outlet.

6. The liquid cooling device according to claim 5, wherein the blocking portion is in contact with a recess sidewall of the recess.

7. The liquid cooling device according to claim 5, wherein the blocking portion is spaced apart from a recess sidewall of the recess.

8. The liquid cooling device according to claim 1, wherein a quantity of the at least one flow inlet is two, a quantity of the at least one flow outlet is two, the two flow outlets are respectively located at two diagonal corners of the cover, and the two flow inlets are located between the two flow outlets.

9. The liquid cooling device according to claim 8, wherein a quantity of the at least one blocking portion is two, the two blocking portions are respectively connected to two opposite sides of the covering portion and respectively block two opposite ends of at least one of the passageways.

10. The liquid cooling device according to claim 9, wherein a quantity of the at least one through slot is two, the two through slots are respectively connected to the two flow inlets, the two flow inlets are not connected to each other, and the two flow outlets are not connected to each other.

11. The liquid cooling device according to claim 10, wherein each of the passageways has a top side facing the cover, the covering portion has a first surface and a second surface opposite the first surface, the first surface is in contact with the cover, the second surface is in contact with a side of the plurality of fins facing the cover, at least one of the passageways is connected to the flow inlet via the through slot, the blocking portion has a third surface and a fourth surface opposite the third surface, the third surface is located closer to the cover than the fourth surface, the third surface is in contact with the cover, the fourth surface is in contact with the first thermal plate so that the two flow inlets are not connected to each other, and the two flow outlets are not connected to each other.

12. A liquid cooling device comprising:
a first thermal plate, having a recess;
a fin structure, located at the recess of the first thermal plate and connected to the first thermal plate, wherein the fin structure comprises a plurality of fins, and every two of the plurality of fins that are adjacent to each other are spaced by a passageway;
a flow-rate adjustment component, having a through slot, wherein the flow-rate adjustment component is in direct contact with the plurality of fins, the through slot is connected to the passageways, and at least two portions of the through slot are different in width; and
a cover, having a flow inlet and a flow outlet, wherein the cover is disposed on the first thermal plate and covers the recess, the flow outlet is connected to the flow inlet via the passageways and the through slot.

13. The liquid cooling device according to claim 12, wherein the through slot has at least one narrower portion and at least one wider portion connected to the at least one narrower portion, and a width of the at least one wider portion is greater than a width of the at least one narrower portion.

14. The liquid cooling device according to claim 13, wherein a quantity of the at least one wider portion is two, and the narrower portion is connected to and located between the two wider portions.

15. The liquid cooling device according to claim 13, wherein a quantity of the at least one narrower portion is two, and the wider portion is connected to and located between the two narrower portions.

16. The liquid cooling device according to claim 12, wherein each of the passageways has a top side facing the cover, the flow-rate adjustment component has a first surface and a second surface opposite the first surface, the second surface is in contact with a side of the plurality of fins facing the cover, the first surface is in contact with the cover, and at least one of the passageways is connected to the flow inlet via the through slot.

17. The liquid cooling device according to claim 16, wherein each of the passageways has two lateral end sides respectively located at two opposite sides of the top side, and the flow outlet is connected to the lateral end sides of the passageways.

18. A liquid cooling device, configured to be in thermal contact with a heat source, the heat source has at least one high heat-generating area and at least one low heat-generating area, the liquid cooling device comprising:
a heat transfer chamber, having an accommodation space, a flow inlet, and a flow outlet, the flow inlet and the flow outlet are connected to the accommodation space, the heat transfer chamber is configured to be in thermal contact with the at least one high heat-generating area and the at least one low heat-generating area of the heat source;
a fin structure, located in the accommodation space and connected to the heat transfer chamber, wherein the fin structure is located above the at least one high heat-generating area and the at least one low heat-generating area of the heat source, the fin structure comprises a plurality of fins, and every two of the plurality of fins that are adjacent to each other are spaced by a passageway; and
a flow-rate adjustment component, located in the accommodation space so that a flow rate of coolant at at least one of the passageways that is located above the at least one high heat-generating area is higher than a flow rate of coolant at another at least one of the passageways that is located above the at least one low heat-generating area.

19. The liquid cooling device according to claim 18, wherein the flow-rate adjustment component comprises a covering portion and at least one blocking portion, the covering portion has a through slot, the covering portion is in contact with the plurality of fins, the through slot is connected to the passageways, and the at least one blocking portion is connected to the covering portion and blocks one end of at least one of the passageways.

20. The liquid cooling device according to claim 19, wherein a quantity of the at least one blocking portion is two, the two blocking portions are respectively connected to two opposite sides of the covering portion and respectively block two opposite ends of at least one of the passageways which is not connected to the flow outlet.

21. The liquid cooling device according to claim 18, wherein the flow-rate adjustment component has a through slot, the flow-rate adjustment component is in contact with the plurality of fins, the through slot is connected to the passageways, and at least two portions of the through slot are different in width.

22. The liquid cooling device according to claim 21, wherein the through slot has at least one narrower portion and at least one wider portion connected to the at least one narrower portion, and a width of the at least one wider portion is greater than a width of the at least one narrower portion.

23. The liquid cooling device according to claim 22, wherein a quantity of the at least one wider portion is two, and the narrower portion is connected to and located between the two wider portions.

24. The liquid cooling device according to claim 22, wherein a quantity of the at least one narrower portion is two, and the wider portion is connected to and located between the two narrower portions.

\* \* \* \* \*